United States Patent
El-Baraji et al.

(10) Patent No.: US 10,546,624 B2
(45) Date of Patent: Jan. 28, 2020

(54) MULTI-PORT RANDOM ACCESS MEMORY

(71) Applicant: SPIN MEMORY, Inc., Fremont, CA (US)

(72) Inventors: Mourad El-Baraji, Fremont, CA (US); Neal Berger, Cupertino, CA (US); Lester Crudele, Tomball, TX (US); Benjamin Louie, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/858,398

(22) Filed: Dec. 29, 2017

(65) Prior Publication Data

US 2019/0206468 A1 Jul. 4, 2019

(51) Int. Cl.
*G11C 11/16* (2006.01)

(52) U.S. Cl.
CPC ...... *G11C 11/1673* (2013.01); *G11C 11/1677* (2013.01); *G11C 11/161* (2013.01)

(58) Field of Classification Search
None
See application file for complete search history.

(56) References Cited

U.S. PATENT DOCUMENTS

| | | |
|---|---|---|
| 4,597,487 A | 7/1986 | Crosby et al. |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakahima et al. |
| 5,695,846 A | 12/1997 | Lange et al. |
| 5,695,864 A | 12/1997 | Zlonczweski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |

(Continued)

FOREIGN PATENT DOCUMENTS

| | | |
|---|---|---|
| CA | 2766141 | 1/2011 |
| CN | 105706259 | 6/2016 |

(Continued)

OTHER PUBLICATIONS

US 7,026,672 B2, 04/2006, Grandis (withdrawn)
(Continued)

*Primary Examiner* — James G Norman

(57) ABSTRACT

A memory device includes a write port, a read port, source lines, bit lines, and word lines orthogonal to the bit lines. The memory device also includes memory cells that can be arrayed in columns that are parallel to the bit lines and in rows that are orthogonal to the bit lines. The memory cells are configured so that a write by the write port to a first memory cell in a column associated with (e.g., parallel to) a first bit line and a read by the read port of a second memory cell in a column associated with (e.g., parallel to) a second, different bit line can be performed during overlapping time periods (e.g., at a same time or during a same clock cycle).

17 Claims, 9 Drawing Sheets

(56) References Cited

U.S. PATENT DOCUMENTS

| | | |
|---|---|---|
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Diao et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |
| 7,663,171 B2 | 2/2010 | Inokuchi et al. |
| 7,675,792 B2 | 3/2010 | Bedeschi |
| 7,696,551 B2 | 4/2010 | Xiao |
| 7,733,699 B2 | 6/2010 | Roohparvar |
| 7,739,559 B2 | 6/2010 | Suzuki et al. |
| 7,773,439 B2 | 8/2010 | Do et al. |
| 7,776,665 B2 | 8/2010 | Izumi et al. |
| 7,796,439 B2 | 9/2010 | Arai |
| 7,810,017 B2 | 10/2010 | Radke |
| 7,821,818 B2 | 10/2010 | Dieny et al. |
| 7,852,662 B2 | 12/2010 | Yang |
| 7,861,141 B2 | 12/2010 | Chen |
| 7,881,095 B2 | 2/2011 | Lu |
| 7,911,832 B2 | 3/2011 | Kent et al. |
| 7,916,515 B2 | 3/2011 | Li |
| 7,936,595 B2 | 5/2011 | Han et al. |

(56) References Cited

U.S. PATENT DOCUMENTS

| | | |
|---|---|---|
| 7,936,598 B2 | 5/2011 | Zheng et al. |
| 7,983,077 B2 | 7/2011 | Park |
| 7,986,544 B2 | 7/2011 | Kent et al. |
| 8,008,095 B2 | 8/2011 | Assefa et al. |
| 8,028,119 B2 | 9/2011 | Miura |
| 8,041,879 B2 | 10/2011 | Erez |
| 8,055,957 B2 | 11/2011 | Kondo |
| 8,058,925 B2 | 11/2011 | Rasmussen |
| 8,059,460 B2 | 11/2011 | Jeong et al. |
| 8,072,821 B2 | 12/2011 | Arai |
| 8,077,496 B2 | 12/2011 | Choi |
| 8,080,365 B2 | 12/2011 | Nozaki |
| 8,088,556 B2 | 1/2012 | Nozaki |
| 8,094,480 B2 | 1/2012 | Tonomura |
| 8,102,701 B2 | 1/2012 | Prejbeanu et al. |
| 8,105,948 B2 | 1/2012 | Thong et al. |
| 8,144,509 B2 | 1/2012 | Jung |
| 8,120,949 B2 | 2/2012 | Ranjan et al. |
| 8,143,683 B2 | 3/2012 | Wang et al. |
| 8,148,970 B2 | 4/2012 | Fuse |
| 8,159,867 B2 | 4/2012 | Cho et al. |
| 8,201,024 B2 | 6/2012 | Burger |
| 8,223,534 B2 | 7/2012 | Chung |
| 8,255,742 B2 | 8/2012 | Ipek |
| 8,278,996 B2 | 10/2012 | Miki |
| 8,279,666 B2 | 10/2012 | Dieny et al. |
| 8,295,082 B2 | 10/2012 | Chua-Eoan |
| 8,334,213 B2 | 12/2012 | Mao |
| 8,345,474 B2 | 1/2013 | Oh |
| 8,349,536 B2 | 1/2013 | Nozaki |
| 8,362,580 B2 | 1/2013 | Chen et al. |
| 8,363,465 B2 | 1/2013 | Kent et al. |
| 8,374,050 B2 | 2/2013 | Zhou et al. |
| 8,386,836 B2 | 2/2013 | Burger |
| 8,415,650 B2 | 4/2013 | Greene |
| 8,416,620 B2 | 4/2013 | Zheng et al. |
| 8,422,286 B2 | 4/2013 | Ranjan et al. |
| 8,422,330 B2 | 4/2013 | Hatano et al. |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong et al. |
| 8,477,530 B2 | 7/2013 | Ranjan et al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,542,524 B2 | 9/2013 | Keshtbod et al. |
| 8,549,303 B2 | 10/2013 | Fifield et al. |
| 8,558,334 B2 | 10/2013 | Ueki et al. |
| 8,559,215 B2 | 10/2013 | Zhou et al. |
| 8,574,928 B2 | 11/2013 | Satoh et al. |
| 8,582,353 B2 | 11/2013 | Lee |
| 8,590,139 B2 | 11/2013 | Op DeBeeck et al. |
| 8,592,927 B2 | 11/2013 | Jan |
| 8,593,868 B2 | 11/2013 | Park |
| 8,609,439 B2 | 12/2013 | Prejbeanu et al. |
| 8,617,408 B2 | 12/2013 | Balamane |
| 8,625,339 B2 | 1/2014 | Ong |
| 8,634,232 B2 | 1/2014 | Oh |
| 8,667,331 B2 | 3/2014 | Hori |
| 8,687,415 B2 | 4/2014 | Parkin et al. |
| 8,705,279 B2 | 4/2014 | Kim |
| 8,716,817 B2 | 5/2014 | Saida |
| 8,716,818 B2 | 5/2014 | Yoshikawa et al. |
| 8,722,543 B2 | 5/2014 | Belen |
| 8,737,137 B1 | 5/2014 | Choy et al. |
| 8,755,222 B2 | 6/2014 | Kent et al. |
| 8,779,410 B2 | 7/2014 | Sato et al. |
| 8,780,617 B2 | 7/2014 | Kang |
| 8,792,269 B1 | 7/2014 | Abedifard |
| 8,802,451 B2 | 8/2014 | Malmhall |
| 8,810,974 B2 | 8/2014 | Noel et al. |
| 8,817,525 B2 | 8/2014 | Ishihara |
| 8,832,530 B2 | 9/2014 | Pangal et al. |
| 8,852,760 B2 | 10/2014 | Wang et al. |
| 8,853,807 B2 | 10/2014 | Son et al. |
| 8,860,156 B2 | 10/2014 | Beach et al. |
| 8,862,808 B2 | 10/2014 | Tsukamoto et al. |
| 8,883,520 B2 | 11/2014 | Satoh et al. |
| 8,902,628 B2 | 12/2014 | Ha |
| 8,966,345 B2 | 2/2015 | Wilkerson |
| 8,987,849 B2 | 3/2015 | Jan |
| 9,019,754 B1 | 4/2015 | Bedeschi |
| 9,025,378 B2 | 5/2015 | Tokiwa |
| 9,026,888 B2 | 5/2015 | Kwok |
| 9,030,899 B2 | 5/2015 | Lee |
| 9,036,407 B2 | 5/2015 | Wang et al. |
| 9,037,812 B2 | 5/2015 | Chew |
| 9,043,674 B2 | 5/2015 | Wu |
| 9,070,441 B2 | 6/2015 | Otsuka et al. |
| 9,070,855 B2 | 6/2015 | Gan et al. |
| 9,076,530 B2 | 7/2015 | Gomez et al. |
| 9,082,888 B2 | 7/2015 | Kent et al. |
| 9,104,581 B2 | 8/2015 | Fee et al. |
| 9,104,595 B2 | 8/2015 | Sah |
| 9,130,155 B2 | 9/2015 | Chepulskyy et al. |
| 9,136,463 B2 | 9/2015 | Li |
| 9,140,747 B2 | 9/2015 | Kim |
| 9,165,629 B2 | 10/2015 | Chih |
| 9,165,787 B2 | 10/2015 | Kang |
| 9,166,155 B2 | 10/2015 | Deshpande |
| 9,178,958 B2 | 11/2015 | Lindamood |
| 9,189,326 B2 | 11/2015 | Kalamatianos |
| 9,190,471 B2 | 11/2015 | Yi et al. |
| 9,196,332 B2 | 11/2015 | Zhang et al. |
| 9,208,888 B1 | 12/2015 | Wakchaure |
| 9,229,806 B2 | 1/2016 | Mekhanik et al. |
| 9,229,853 B2 | 1/2016 | Khan |
| 9,231,191 B2 | 1/2016 | Huang et al. |
| 9,245,608 B2 | 1/2016 | Chen et al. |
| 9,250,990 B2 | 2/2016 | Motwani |
| 9,250,997 B2 | 2/2016 | Kim et al. |
| 9,251,896 B2 | 2/2016 | Ikeda |
| 9,257,483 B2 | 2/2016 | Ishigaki |
| 9,263,667 B1 | 2/2016 | Pinarbasi |
| 9,286,186 B2 | 3/2016 | Weiss |
| 9,298,552 B2 | 3/2016 | Leem |
| 9,299,412 B2 | 3/2016 | Naeimi |
| 9,317,429 B2 | 4/2016 | Ramanujan |
| 9,324,457 B2 | 4/2016 | Takizawa |
| 9,337,412 B2 | 5/2016 | Pinarbasi et al. |
| 9,341,939 B1 | 5/2016 | Yu et al. |
| 9,342,403 B2 | 5/2016 | Keppel et al. |
| 9,349,482 B2 | 5/2016 | Kim et al. |
| 9,351,899 B2 | 5/2016 | Bose et al. |
| 9,362,486 B2 | 6/2016 | Kim et al. |
| 9,378,817 B2 | 6/2016 | Kawai |
| 9,379,314 B2 | 6/2016 | Park et al. |
| 9,389,954 B2 | 7/2016 | Pelley et al. |
| 9,396,065 B2 | 7/2016 | Webb et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,431,084 B2 | 8/2016 | Bose et al. |
| 9,449,720 B1 | 9/2016 | Lung |
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |
| 9,548,116 B2 | 1/2017 | Roy |
| 9,548,445 B2 | 1/2017 | Lee et al. |
| 9,553,102 B2 | 1/2017 | Wang |
| 9,583,167 B2 | 2/2017 | Chan |
| 9,594,683 B2 | 3/2017 | Dittrich |
| 9,600,183 B2 | 3/2017 | Tomishima et al. |

(56) References Cited

U.S. PATENT DOCUMENTS

| | | |
|---|---|---|
| 9,608,038 B2 | 3/2017 | Wang et al. |
| 9,634,237 B2 | 4/2017 | Lee et al. |
| 9,640,267 B2 | 5/2017 | Tani |
| 9,646,701 B2 | 5/2017 | Lee |
| 9,652,321 B2 | 5/2017 | Motwani |
| 9,662,925 B2 | 5/2017 | Raksha et al. |
| 9,697,140 B2 | 7/2017 | Kwok |
| 9,720,616 B2 | 8/2017 | Yu |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 10,318,421 B2 | 6/2019 | Pirvu |
| 2002/0090533 A1 | 7/2002 | Zhang et al. |
| 2002/0105823 A1 | 8/2002 | Redon et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0228411 A1 | 11/2004 | Iwamura |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa |
| 2007/0159894 A1* | 7/2007 | Huber ............... G11C 7/062 365/189.15 |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0124091 A1 | 5/2010 | Cowburn |
| 2010/0162065 A1 | 6/2010 | Norman |
| 2010/0193891 A1 | 8/2010 | Wang et al. |
| 2010/0195362 A1* | 8/2010 | Norman ............... G11C 7/1075 365/51 |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |
| 2012/0069649 A1 | 3/2012 | Ranjan et al. |
| 2012/0155156 A1 | 6/2012 | Watts |
| 2012/0155158 A1 | 6/2012 | Higo |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0039119 A1* | 2/2013 | Rao ............... G11C 8/08 365/148 |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0173221 A1 | 6/2014 | Samih |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2015/0056368 A1 | 2/2015 | Wang et al. |
| 2015/0279904 A1 | 10/2015 | Pinarbasi et al. |
| 2016/0087193 A1 | 3/2016 | Pinarbasi et al. |
| 2016/0163973 A1 | 6/2016 | Pinarbasi |
| 2016/0218278 A1 | 7/2016 | Pinarbasi et al. |
| 2016/0283385 A1 | 9/2016 | Boyd et al. |
| 2016/0315118 A1 | 10/2016 | Kardasz et al. |
| 2016/0378592 A1 | 12/2016 | Ikegami et al. |
| 2017/0062712 A1 | 3/2017 | Choi et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2017/0270988 A1* | 9/2017 | Ikegami ............... G11C 11/1655 |
| 2018/0033957 A1 | 2/2018 | Zhang |
| 2018/0097006 A1 | 4/2018 | Kim et al. |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |

(56) References Cited

U.S. PATENT DOCUMENTS

| | | |
|---|---|---|
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)

Bhatti Sabpreet et al., "Spintronics Based Random Access Memory: a Review," Material Today, Nov. 21, 2007, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

\* cited by examiner

MULTI-PORT RANDOM ACCESS MEMORY

BACKGROUND

Magnetoresistive random access memory (MRAM) is a non-volatile memory technology that stores data through magnetic storage elements. The elements are two ferromagnetic plates or electrodes that can hold a magnetic field and are separated by a non-magnetic material, such as a non-magnetic metal or insulator. This structure is known as a magnetic tunnel junction (MTJ). MRAM devices are considered to be a next generation structure for a wide range of memory applications.

FIG. 1 illustrates an example of an MRAM cell 110 including an MTJ 120. In general, one of the plates (a reference layer or fixed layer 130) has its magnetization pinned, meaning that this layer has a higher coercivity than the other layer and requires a larger magnetic field or spin-polarized current to change the orientation of its magnetization. The second plate is typically referred to as the free layer 140 and its magnetization direction can be changed by a smaller magnetic field or spin-polarized current relative to that of the reference layer 130. The two plates can be sub-micron in lateral size, and the magnetization direction can still be stable with respect to thermal fluctuations.

MRAM devices can store information by changing the orientation of the magnetization of the free layer 140. In particular, based on whether the free layer 140 is in a parallel or anti-parallel alignment relative to the reference layer 130, either a binary value of "1" or a binary value of "0" can be stored in the MRAM cell 110 as represented in FIG. 1.

MRAM products based on spin transfer torque switching, or spin transfer switching, are already making their way into larger data storage devices. Spin transfer torque MRAM (STT-MRAM) devices, such as the one illustrated in FIG. 1, use spin-aligned (polarized) electrons to change the magnetization orientation of the free layer in the magnetic tunnel junction. In general, electrons possess a quantized number of angular momentum intrinsic to the electron referred to as spin. An electrical current is generally unpolarized; that is, it consists of 50% spin-up and 50% spin-down electrons. By passing a current though a magnetic layer, electrons are polarized with a spin orientation corresponding to the magnetization direction of the magnetic layer (e.g., polarizer), thereby producing a spin-polarized current. If the spin-polarized current is passed to the magnetic region of the free layer 140 in the MTJ device, the electrons will transfer a portion of their spin-angular momentum to the magnetization layer to produce a torque on the magnetization of the free layer. This spin transfer torque can switch the magnetization of the free layer 140, which in effect writes either a "1" or a "0" based on whether the free layer is in the parallel or anti-parallel state relative to the reference layer 130.

Due to the spin-polarized electron tunneling effect, the electrical resistance of the cell changes due to the orientation of the magnetic fields of the two layers 130 and 140. The electrical resistance is typically referred to as tunnel magnetoresistance (TMR), which is a magnetoresistance effect that occurs in an MTJ. The cell's resistance will be different for the parallel and anti-parallel states, and thus the cell's resistance can be used to distinguish between a "1" and a "0".

STT-M RAM has an inherently stochastic write mechanism, in which bits have a certain probability of write failure on any given write cycle. The write failures are most generally random, and have a characteristic failure rate. A high write error rate may make the memory unreliable. The error rate can increase with age and increased use of the memory. Bit errors can result in system crashes, but even if a bit error does not result in a system crash, it can still be a problem because the error can linger in the system, causing incorrect calculations that can propagate into subsequent data. This is especially problematic in certain applications (e.g., financial, medical, and automotive applications) and is generally commercially unacceptable. The corrupted data can also propagate to other storage media and grow to an extent that is difficult to diagnose and recover.

In an MRAM write operation, a subsequent verify operation can be used to check if the write operation has completed successfully and that the correct data has been written. A verify can be implemented with a bias condition where the bit line is driven to a high potential while the source line is driven to a low potential to generate current across the MTJ so that the resistance measurement can be made. After data is written, the verify consists of reading the written data and, for example, executing error correcting code to confirm that the written data is correct. Hence, a verify operation is analogous to a read operation.

Thus, in a write-verify operation, bit values are written to memory cells then read from those memory cells. The verify operation can delay a subsequent write to other memory cells or can limit which memory cells can be written to while the verify operation is being performed.

SUMMARY

Embodiments according to the present invention address the problem described above using a multi-port memory device that can access two or more memory cells at a same time. That is, a write to a memory cell can be performed while a read of another memory cell is being performed (before the read is completed), and a read of a memory cell can be performed while a write to another memory cell is being performed (before the write is completed).

More specifically, in embodiments according to the present invention, a memory device includes a write port, a read port, source lines, bit lines, and word lines orthogonal to the bit lines. The memory device also includes memory cells that can be, for instance, arrayed in columns that are parallel to the bit lines and in rows that are orthogonal to the bit lines. The memory cells are configured so that a write by the write port to a first memory cell in a column associated with (e.g., parallel to) a first bit line, and a read by the read port of a second memory cell in a column associated with (e.g., parallel to) a second, different bit line, can be performed within overlapping time periods or in a same clock cycle. That is, the write and the read can be performed simultaneously, or the time period during which the write is being performed can overlap wholly or in part the time period during which the read is being performed, and vice versa. In an embodiment, the write to the first memory cell is followed by a verify of the first memory cell.

In embodiments, the first memory cell includes a first transistor having a first gate coupled to a first word line, a second transistor having a second gate coupled to a second word line, and a first storage element for storing a first binary bit value, and the second memory cell includes a third transistor having a third gate coupled to a third word line, a fourth transistor having a fourth gate coupled to a fourth word line, and a second storage element for storing a second binary bit value. In these embodiments, the write to the first memory cell includes activating the first transistor with a first voltage provided over the first word line to the first gate while the second transistor is inactive, and while a current is supplied to the first bit line then to the first storage element and the first transistor to a first source line. In these embodiments, the read of the second memory cell includes activating the fourth transistor with a second voltage provided over the second word line to the fourth gate while the third transistor is inactive, and while a current is supplied to the second bit line then to the second storage element and the fourth transistor to a second source line.

In embodiments, one or more additional write ports, and/or one or more additional read ports, can be added to the memory device by adding one or more additional transistors to the memory cells.

For example, in embodiments, the memory device includes a second write port, in which case the first memory cell also includes an additional transistor (a fifth transistor) having a gate (a fifth gate) coupled to a third word line, and the second memory cell also includes an additional transistor (a sixth transistor) having its gate (a sixth gate) coupled to a fourth word line. In these embodiments, a write by the second write port to the first memory cell includes activating the fifth transistor with a third voltage provided over the third word line to the fifth gate while the first and second transistors are inactive, and while a current is supplied to the first bit line then to the first storage element and the fifth transistor to a third source line.

For example, in embodiments, the memory device includes a second read port, in which case the first memory cell also includes an additional transistor (a fifth transistor) having its gate (a fifth gate) coupled to a third word line, and the second memory cell also includes an additional transistor (a sixth transistor) having its gate (a sixth gate) coupled to a fourth word line. In these embodiments, a read by the second write port of the second memory cell includes activating the sixth transistor with a third voltage provided over the third word line to the sixth gate while the third and fourth transistors are inactive, and while a current is supplied to the second bit line then to the second storage element and the sixth transistor to a third source line.

In some embodiments, the voltage applied to a word line used for a write is larger than the voltage applied to a word line used for a read; however, the present invention is not so limited.

In an embodiment, the memory cells include magnetoresistive random access memory (MRAM) cells, particularly spin transfer torque MRAM (STT-MRAM) cells that include magnetic tunnel junctions (MTJs).

In summary, using a dual port or multi-port memory device, two or more memory cells can be accessed at a same time (simultaneously, or during overlapping time periods, or during the same clock cycle). Thus, for example, a read or a verify of one memory cell in a memory array in a memory device can be performed while a write or rewrite is performed to another memory cell in the memory array, and vice versa. Also, a write to one memory cell can be performed while a rewrite to another memory cell is performed, and vice versa. Consequently, memory operations can be performed more frequently, improving performance of the memory device.

These and other objects and advantages of the various embodiments of the present invention will be recognized by those of ordinary skill in the art after reading the following detailed description of the embodiments that are illustrated in the various drawing figures.

BRIEF DESCRIPTION OF DRAWINGS

The accompanying drawings, which are incorporated in and form a part of this specification and in which like numerals depict like elements, illustrate embodiments of the present disclosure and, together with the detailed description, serve to explain the principles of the disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computing system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "reading," "writing," "verifying," "activating," "storing," "supplying," "providing," "performing," or the like, refer to actions and processes (e.g., the flowchart 600 of FIG. 6) of a computing system or similar electronic computing device or hardware processor (e.g., the system 700 of FIG. 7). The computing system or similar electronic computing device manipulates and transforms data represented as physical (electronic) quantities within the computing system memories, registers or other such information storage, transmission or display devices.

Multi-Port Random Access Memory

Figure 1:
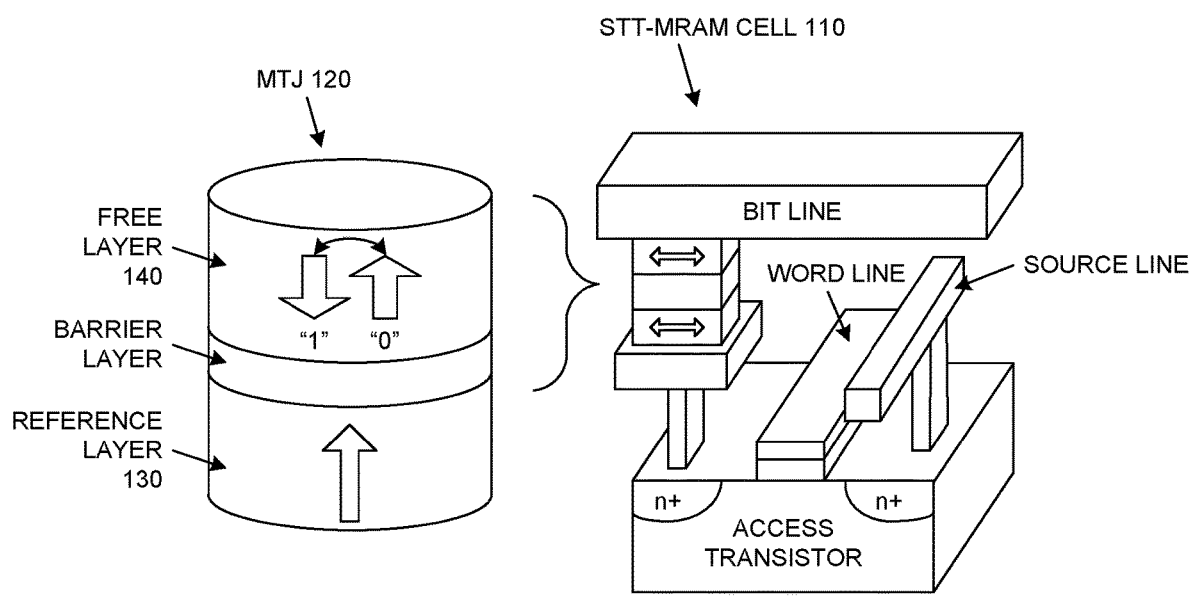
FIG. 1 illustrates an example of a conventional magnetoresistive random access memory cell.
Figure 2A:
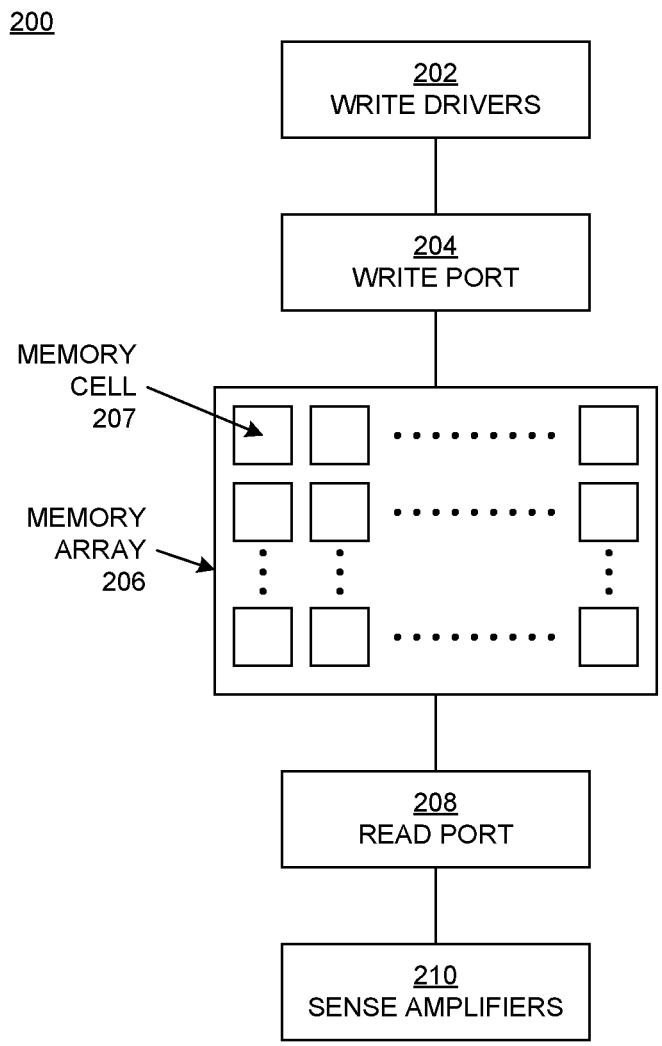
FIG. 2A illustrates a dual port memory device in embodiments according to the present invention.

FIG. 2A illustrates a dual port memory device in embodiments according to the present invention. In embodiments, the memory device 200 is a magnetoresistive random access memory (MRAM) device. In an embodiment, the memory device 200 is a spin transfer torque (STT-MRAM) device.

The memory array 206 includes a number of memory cells or storage elements exemplified by the memory cell 207. As just noted, the memory cell 207 may be an MRAM cell. In embodiments, an MRAM cell includes a magnetic tunnel junction (MTJ). As will be described further below, the memory cells in the memory device 200 are configured to enable two or more of the memory cells to be accessed within the same time period (e.g., at the same time). More specifically, in embodiments according to the present invention, the memory cell 300 of FIG. 3, the memory cell 400 of FIG. 4A, and the memory cell 450 of FIG. 4B are examples of the memory cell 207.

Referring again to FIG. 2A, the memory device 200 (memory array 206) includes a number of word lines, a number of bit lines, and a number of source lines (shown in the figures to follow). The memory cells in the memory array 206 can be arrayed in columns and rows, in which case the columns are parallel to the bit lines and the rows are parallel to the word lines. The memory cell 207 is individually addressable using a row address, which specifies a particular word line, and a column address, which specifies a particular bit line and source line, where the memory cell 207 is at the intersection of the specified word and bit lines. A number of memory cells are typically accessed together to form a data word.

The memory device 200 includes write drivers 202 and a write port 204. The write drivers 202 decode a row address signal and a column address signal and supply signals (data) to the write port 204. The write port 204 includes elements such as a write address bus, write registers, and a set of data inputs to import the data for writing to the memory array 206.

The memory device 200 also includes a read port 208. The read port 208 includes elements such as a read address bus, read registers, and a set of data outputs for reading data from the memory array 206. The read port 208 outputs the data to sense amplifiers 210. Each sense amplifier can receive a voltage corresponding to the memory cell being read (the addressed memory cell) and, by comparing that voltage to a reference voltage, can determine whether that memory cell stored a first binary value (e.g., "1") or a second binary value (e.g., "0").

Figure 2B:
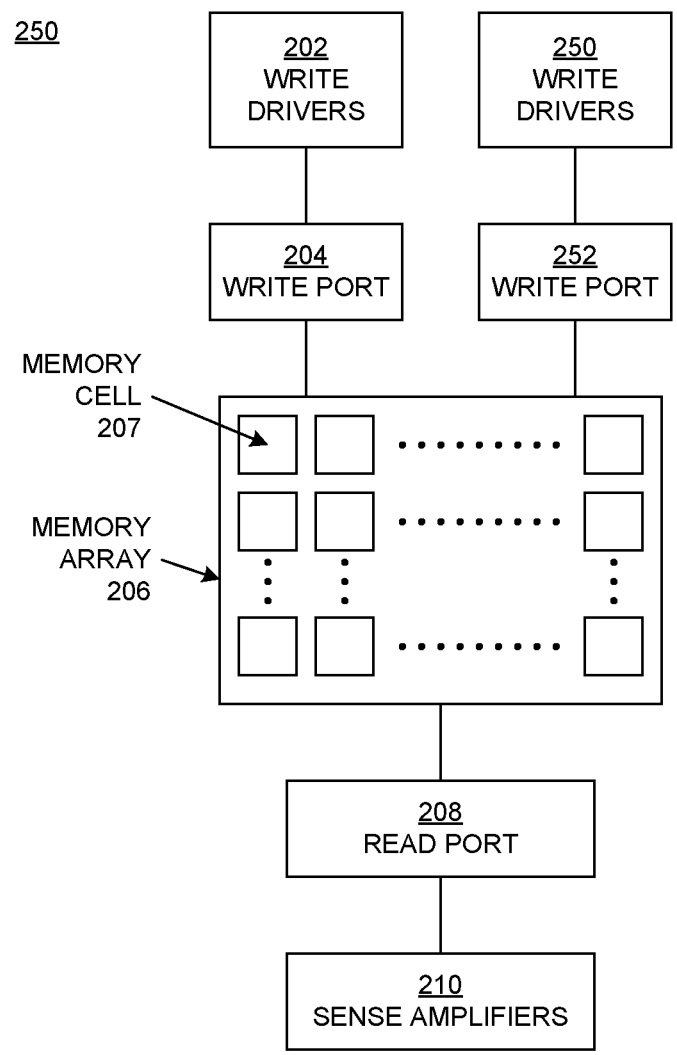
FIG. 2B illustrates a multi-port memory device that includes a read port and two write ports in embodiments according to the present invention.
Figure 2C:
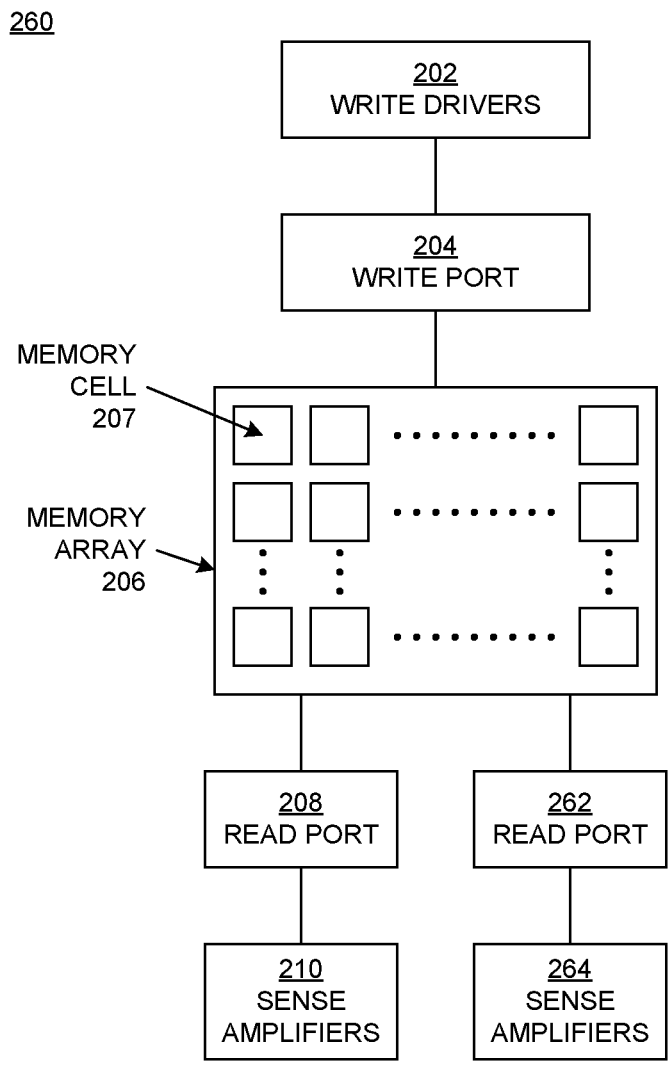
FIG. 2C illustrates a multi-port memory device that includes a write port and two read ports in embodiments according to the present invention.

The read port 208 and the write port 204 can operate independently of each other. Memory devices in embodiments according to the present invention may include a single read port and a single write port (referred to herein as a dual port memory or MRAM) or multiple write ports and/or multiple read ports (referred to herein as a multi-port memory or MRAM). FIG. 2B illustrates a memory device 250 that includes a second write port 252 that can operate independently of the read port 208 and the write port 204. To support concurrent operations, the write driver 202 can be associated with the first write port 204, and a second write driver can be associated with the second write port 252. FIG. 2C illustrates a memory device 260 that includes a second read port 262 that can operate independently of the read port 208 and the write port 204. To support concurrent operations, the set of sense amplifiers 210 can be associated with the first read port 208, and a second set of sense amplifiers 264 can be associated with the second read port 262.

Figure 3:
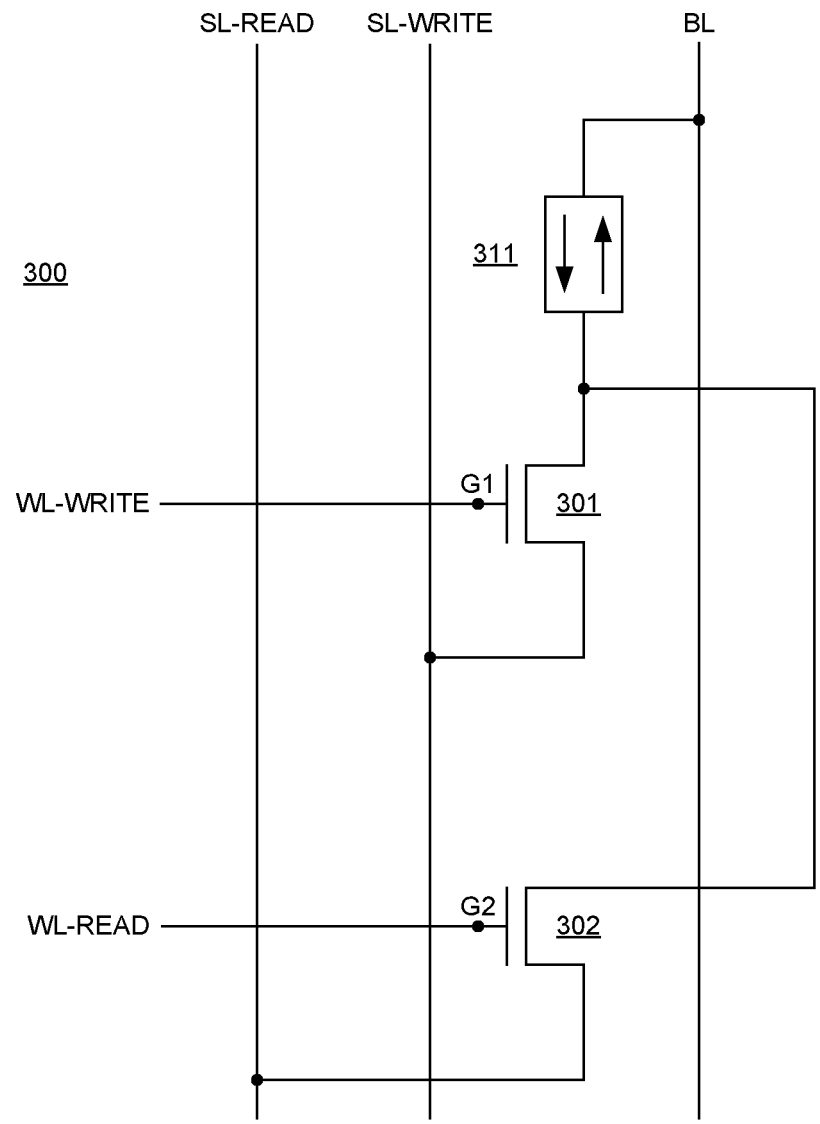
FIG. 3 illustrates a memory cell that can be used in a dual port memory device in embodiments according to the present invention.

FIG. 3 illustrates a memory cell 300 that can be used in a dual port memory device (e.g., the memory device 200 of FIG. 2A) in embodiments according to the present invention. The memory cell 300 is an example of the memory cell 207 of FIG. 2A.

In the embodiments of FIG. 3, the memory cell 300 includes a storage element 311 for storing a binary bit value, write circuitry for writing a bit value to the storage element, and read circuitry for reading a bit value from the storage element. The write circuitry includes a first transistor 301 having its gate G1 coupled to a first word line WL-write, and the read circuitry includes a second transistor 302 having its gate G2 coupled to a second word line WL-read. In an embodiment, the storage element 311 is an MRAM cell that includes an MTJ.

In a write operation, the first transistor 301 is activated with a first voltage provided over the first word line WL-write to the gate G1 while the second transistor 302 is inactive, and while a current I-write is supplied to the bit line BL then to the storage element 311 and the first transistor to a first source line SL-write.

In a read operation, the second transistor 302 is activated with a second voltage provided over the second word line WL-read to the gate G2 while the first transistor 301 is inactive, and while a current I-read is supplied to the bit line BL then to the storage element 311 and the second transistor to a second source line SL-read.

Figure 4A:
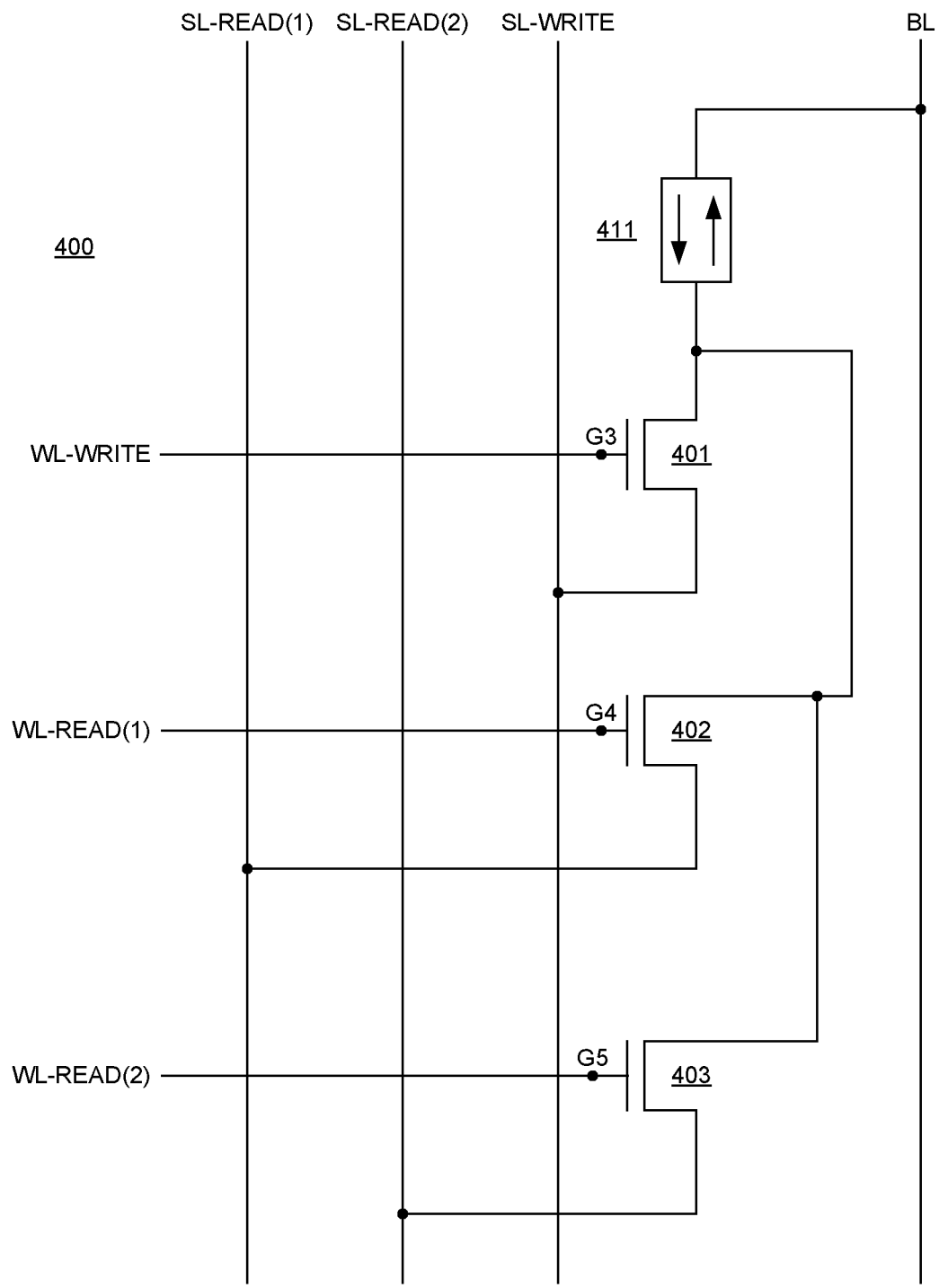
FIGS. 4A and 4B illustrate memory cells that can be used in multi-port memory devices in embodiments according to the present invention.
Figure 4B:
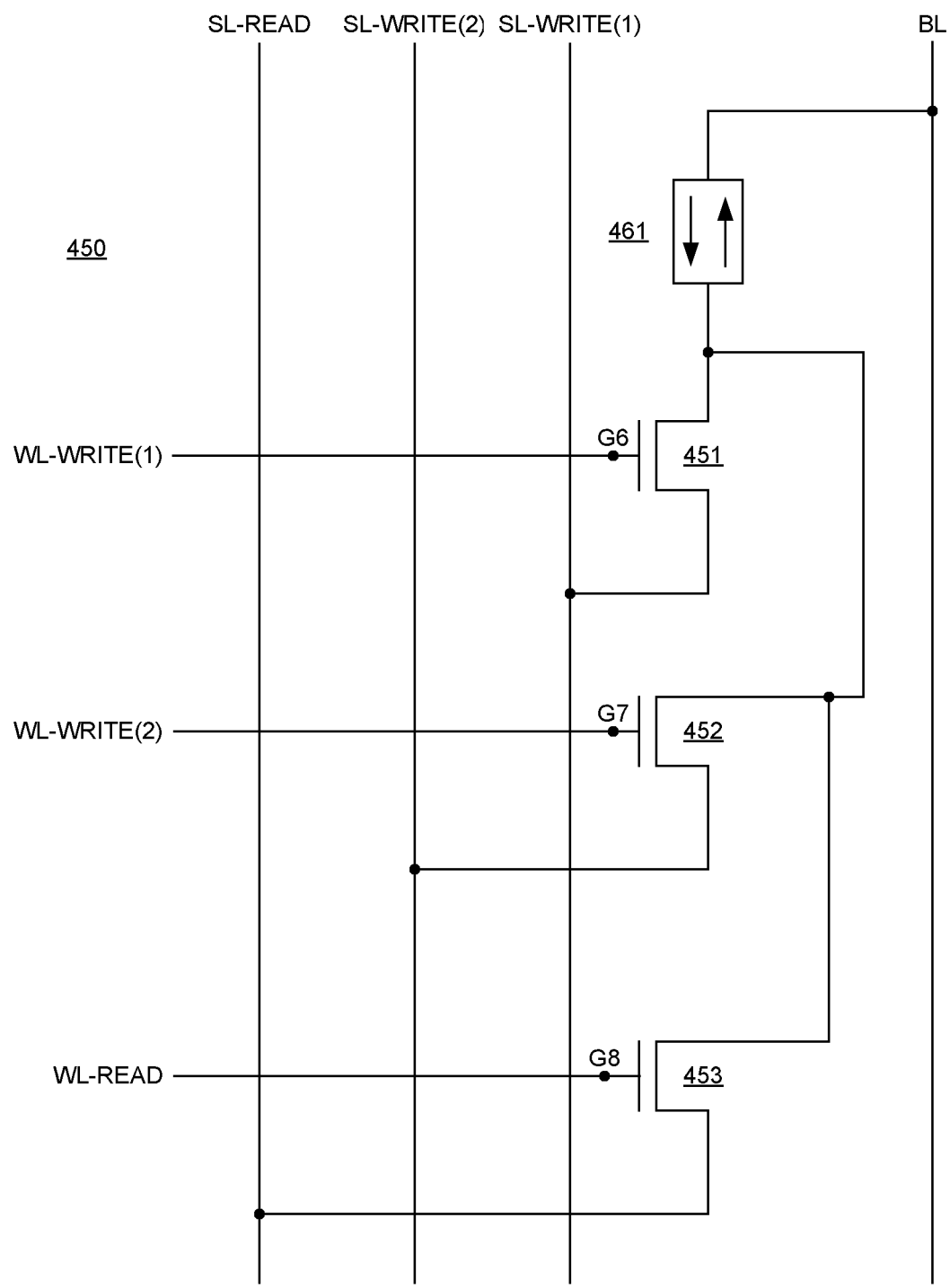

FIG. 4A illustrates a memory cell 400 that can be used in a multi-port memory device in embodiments according to the present invention. The memory cell 400 is an example of the memory cell 207 of FIG. 2C.

In the embodiments of FIG. 4A, the memory device 400 includes a single write port and two read ports as in the example of FIG. 2C. The memory cell 400 includes a storage element 411 for storing a binary bit value, write circuitry for writing a bit value to the storage element, and read circuitry for reading a bit value from the storage element. The write circuitry includes a first transistor 401 having its gate G3 coupled to a first word line WL-write. The read circuitry includes a second transistor 402 having its gate G4 coupled to a second word line WL-read(1) and a third transistor 403 having its gate G5 coupled to a third word line WL-read(2). In an embodiment, the storage element 411 is an MRAM cell that includes an MTJ.

In a write operation, the first transistor 401 is activated with a first voltage provided over the first word line WL-write to the gate G3 while the second transistor 402 and the third transistor 403 are inactive, and while a current I-write is supplied to the bit line BL then to the storage element 411 and the first transistor to a first source line SL-write.

In a read operation using the first read port 208 (FIG. 2C), the second transistor 402 is activated with a second voltage provided over the second word line WL-read(1) to the gate G4 while the first transistor 401 and the third transistor 403 are inactive, and while a current I-read is supplied to the bit line BL then to the storage element 411 and the second transistor to a second source line SL-read(1).

In a read operation using the second read port 262 (FIG. 2C), the third transistor 403 is activated with a third voltage provided over the third word line WL-read(2) to the gate G5 while the first transistor 401 and the second transistor 402 are inactive, and while a current I-read is supplied to the bit line BL then to the storage element 411 and the third transistor to a third source line SL-read(2).

FIG. 4B illustrates a memory cell 450 that can be used in a multi-port memory device in embodiments according to the present invention. The memory cell 450 is an example of the memory cell 207 of FIG. 2B.

In the embodiments of FIG. 4B, the memory device 450 includes two write ports and a single read port as in the example of FIG. 2B. The memory cell 450 includes a storage element 461 for storing a binary bit value, write circuitry for writing a bit value to the storage element, and read circuitry for reading a bit value from the storage element. The write circuitry includes a first transistor 451 having its gate G6 coupled to a first word line WL-write(1) and a second transistor 452 having its gate G7 coupled to a second word line WL-write(2). The read circuitry includes a third transistor 453 having its gate G8 coupled to a third word line WL-read. In an embodiment, the storage element 461 is an MRAM cell that includes an MTJ.

In a write operation using the first write port 204 (FIG. 2B), the first transistor 451 is activated with a first voltage provided over the first word line WL-write(1) to the gate G6 while the second transistor 452 and the third transistor 453 are inactive, and while a current I-write is supplied to the bit line BL then to the storage element 451 and the first transistor to a first source line SL-write(1).

In a write operation using the second write port 252 (FIG. 2B), the second transistor 452 is activated with a second voltage provided over the second word line WL-write(2) to the gate G7 while the first transistor 451 and the third transistor 453 are inactive, and while a current I-write is supplied to the bit line BL then to the storage element 461 and the second transistor to a second source line SL-write(2).

In a read operation, the third transistor 453 is activated with a third voltage provided over the third word line WL-read to the gate G8 while the first transistor 451 and the second transistor 452 are inactive, and while a current I-read is supplied to the bit line BL then to the storage element 461 and the third transistor to a third source line SL-read.

In embodiments, the voltage applied to a word line used for a write (e.g., WL-write) is larger than the voltage applied to a word line used for a read (e.g., WL-read). The voltage applied to transistor gate for a write is about 1.8-2.0 volts, while the voltage applied to a transistor gate for read is about 1.2 volts.

Figure 5:
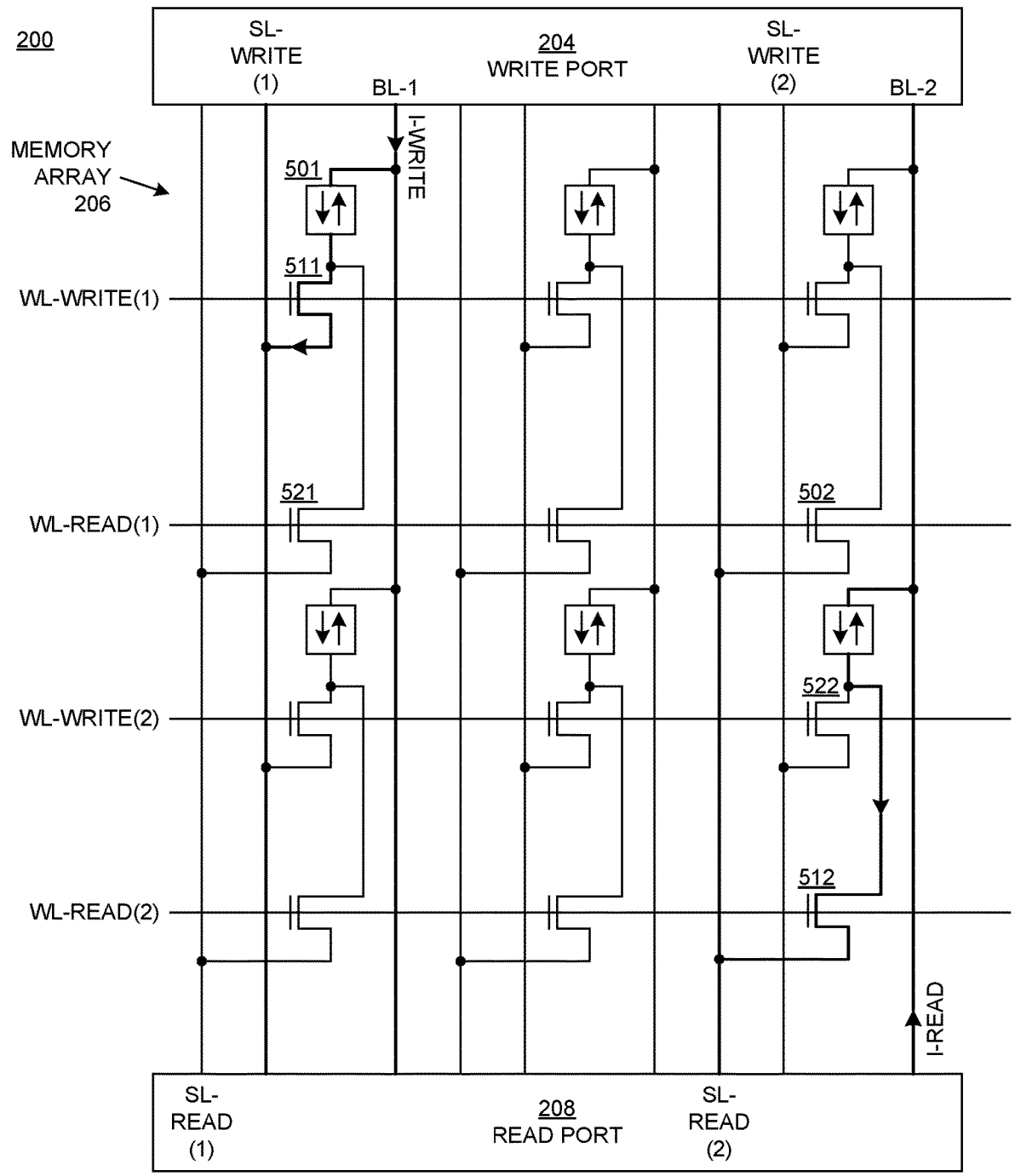
FIG. 5 illustrates a write (or a rewrite) to a first storage element in a first memory cell and a read of (or a verify of) a second storage element in a second memory cell of a dual port memory device in embodiments according to the present invention.

FIG. 5 illustrates a write (or a rewrite) to a first storage element 501 in a first memory cell and a read of (or a verify of) a second storage element 502 in a second memory cell within overlapping time periods (e.g., at a same time or within a same clock cycle) in a dual port memory device 200 in embodiments according to the present invention. Each memory cell in the memory array 206 is an example of the memory cell 207 of FIG. 2A. In an embodiment, the storage elements 501 and 502 are each an MRAM cell that includes an MTJ.

In the example of FIG. 5, three columns and two rows of memory cells are included in the memory array 500; however, the present invention is not so limited. The write (or rewrite) can be made to any of the memory cells in the memory array 500 in overlapping time periods (e.g., at a same time) as a read (or verify) to any other memory cell in the memory array as long as those two memory cells are not using the same bit line (that is, they are in different columns).

In the write to the first storage element 501, the transistor 511 is activated with a voltage provided over the word line WL-write(1) to the gate of that transistor while the transistor 521 is inactive and while a current I-write is supplied to the bit line BL-1 then to the storage element 501 and the transistor 511 to the source line SL-write(1). In this example, if a read begins before the write, then the write can be performed before the read is completed.

At the same time, or before the above write is completed, a read of the second storage element 502 can be performed. In the read, the transistor 512 is activated with a voltage provided over the word line WL-read(2) to the gate of that transistor while the transistor 522 is inactive and while a current I-read is supplied to the bit line BL-2 then to the storage element 502 and the transistor 512 to the source line SL-read(2).

Figure 6:
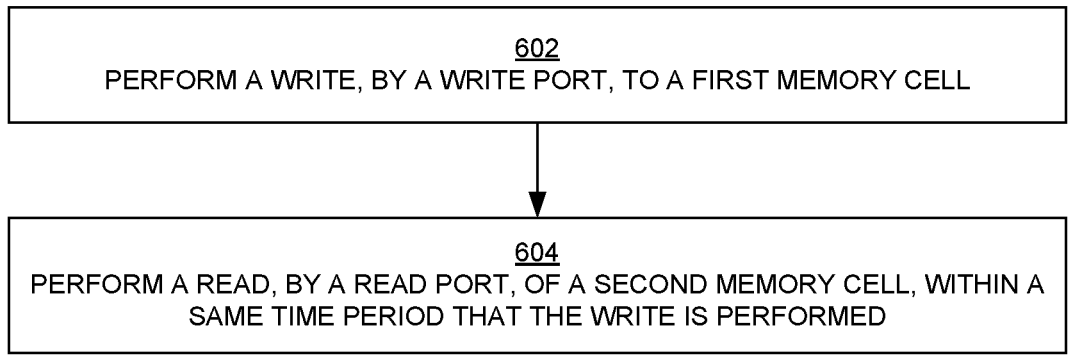
FIG. 6 is a flowchart of examples of operations in a method for reading and writing data from and to memory cells in a dual port or multi-port memory device in embodiments according to the present invention.

FIG. 6 is a flowchart 600 of examples of circuit-implemented operations in a method for reading and writing data from and to memory cells in a dual port or multi-port memory device in embodiments according to the present invention, such as the embodiments described above with reference to FIGS. 2A, 2B, 2C, 3, 4A, 4B, and 5. The operations can be performed in and by memory accessing circuits in the computing system 700 of FIG. 7.

In block 602 of FIG. 6, a write is performed, by a write port, to a first memory cell in a column of memory cells that is associated with (e.g., parallel to) a first bit line.

In block 604, a read is performed, by a read port, of a second memory cell in a column of memory cells that is associated with (e.g., parallel to) a second bit line different from the first bit line. Significantly, the write and the read are both performed within a same time period (e.g., during a same clock cycle).

Thus, two or more memory cells can be accessed at a same time (e.g., simultaneously, or during overlapping periods of time). Thus, for example, a read or a verify of one memory cell in a memory array in a memory device can be performed while a write or rewrite is performed to another memory cell in the memory array, and vice versa. Also, a write to one memory cell can be performed while a rewrite to another memory cell is performed, and vice versa. That is, the write (or rewrite) and the read (or verify) can be performed at the same time (e.g., within the same clock cycle), or the time period during which the write/rewrite is being performed can overlap, wholly or in part, the time period during which the read/verify is being performed. Consequently, memory operations can be performed more frequently, improving performance of the memory device.

Co-pending U.S. patent application Ser. No. 15/857,220, entitled "Perpendicular Source and Bit Lines for an MRAM Array," by Neal Berger et al., filed Dec. 28, 2017, is hereby incorporated by reference in its entirety. Embodiments according to the present disclosure can be implemented in or with an MRAM array as disclosed in the referenced application.

Co-pending U.S. patent application Ser. No. 15/857,241, entitled "A Memory Array with Horizontal Source Line and a Virtual Source Line," by Neal Berger et al., filed Dec. 28, 2017, is hereby incorporated by reference in its entirety. Embodiments according to the present disclosure can be implemented in or with an MRAM array as disclosed in the referenced application.

Co-pending U.S. patent application Ser. No. 15/857,264, entitled "A Memory Array with Horizontal Source Line and Sacrificial Bitline per Virtual Source," by Neal Berger et al., filed Dec. 28, 2017, is hereby incorporated by reference in its entirety. Embodiments according to the present disclosure can be implemented in or with an MRAM array as disclosed in the referenced application.

Figure 7:
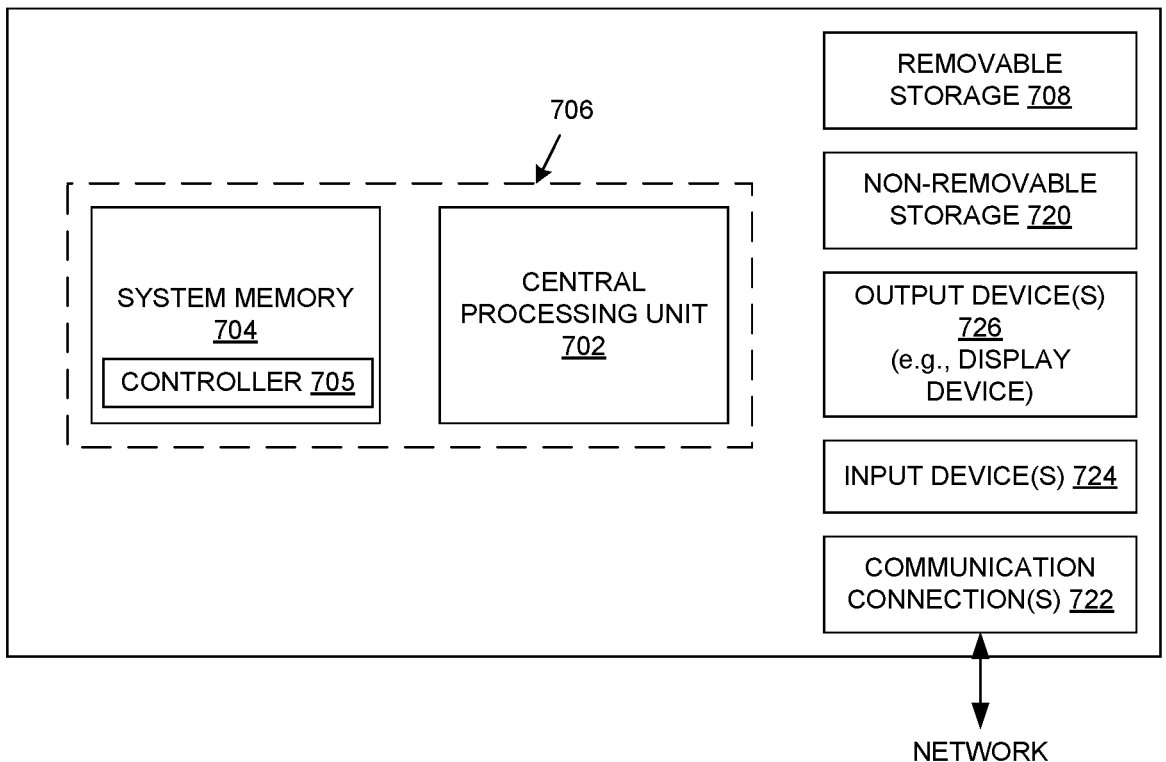
FIG. 7 is an example of a computing system upon which embodiments according to the present invention can be implemented.

FIG. 7 is an example of a computing system 700 upon which embodiments according to the present invention can be implemented. In its most basic configuration, the system 700 includes at least one processing unit 702 and memory 704. This most basic configuration is illustrated in FIG. 7 by dashed line 706. In embodiments, the memory 704 is or includes a dual port or multi-port memory device such as those described above. In an embodiment, the memory 704 is or includes MRAM, in particular STT-MRAM. In an embodiment, the memory 704 includes a controller 705 that performs the operations described herein, in particular the operations of FIG. 6.

The system 700 may also have additional features and/or functionality. For example, the system 700 may also include additional storage (removable and/or non-removable). Such additional storage is illustrated in FIG. 7 by removable storage 708 and non-removable storage 720. The system 700 may also contain communications connection(s) 722 that allow the device to communicate with other devices, e.g., in a networked environment using logical connections to one or more remote computers.

The system 700 can also include input device(s) 724 such as keyboard, mouse, pen, voice input device, touch input device, etc. Output device(s) 726 such as a display device, speakers, printer, etc., are also included.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The example methods described and/or illustrated herein may also omit one or more of the steps described or illustrated herein or include additional steps in addition to those disclosed.

Although the subject matter has been described in language specific to structural features and/or methodological acts, it is to be understood that the subject matter defined in the disclosure is not necessarily limited to the specific features or acts described above. Rather, the specific features and acts described above are disclosed as example forms of implementing the disclosure.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), magnetoresistive random access memory (MRAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can be accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Descriptors such as "first,""second," "third,""fourth," "fifth" and "sixth" are used herein to differentiate between like elements, but do not necessarily indicate a particular order of those elements, and also do not necessarily indicate a specific number of those elements. Thus, for example, a first memory cell in a memory array that is described as including a first transistor, a second transistor, and a fifth transistor does not necessarily indicate that the memory cell includes five transistors, and a second memory cell in the memory array described as having a third transistor, a fourth transistor, and a sixth transistor does not necessarily indicate that the memory cell has six transistors; instead, those descriptors are used merely to differentiate the transistors in the first memory cell from the transistors in the second memory cell.

Embodiments according to the present invention are thus described. While the present invention has been described in particular embodiments, it should be appreciated that the present invention should not be construed as limited by such embodiments, but rather construed according to the following claims.

What is claimed is:
1. A memory device, comprising:
a write port;
a read port;

a plurality of source lines, a plurality of bit lines, and a plurality of word lines, wherein the word lines are orthogonal to the bit lines; and an array of memory cells coupled to the write port, the read port, the source lines, the bit lines, and the word lines, wherein the memory cells are arrayed in a plurality of columns that are parallel to the bit lines and in a plurality of rows that are orthogonal to the bit lines, and wherein each memory cell of the memory cells comprises a respective magnetoresistive random access memory (MRAM) cell comprising a magnetic tunnel junction (MTJ) that stores a respective binary bit value;

wherein a first memory cell of the memory cells comprises a first transistor having a first gate coupled to a first word line of the plurality of word lines and a first source coupled to a first source line of the plurality of source lines, a second transistor having a second gate coupled to a second word line of the plurality of word lines and a second source coupled to a second source line of the plurality of source lines, and a first storage element for storing a first binary bit value, and wherein a second memory cell of the memory cells comprises a third transistor having a third gate coupled to a third word line of the plurality of word lines and a third source coupled to a third source line of the plurality of source lines, a fourth transistor having a fourth gate coupled to a fourth word line of the plurality of word lines and a fourth source coupled to a fourth source line of the plurality of source lines, and a second storage element for storing a second binary bit value, and wherein a write by the write port to the first memory cell comprises activating the first transistor with a first voltage provided over the first word line to the first gate while the second transistor is inactive and while a current is supplied to a first bit line then to the first storage element and the first transistor to the first source line; and wherein a read by the read port of the second memory cell comprises activating the fourth transistor with a second voltage provided over the fourth word line to the fourth gate while the third transistor is inactive and while a current is supplied to a second bit line then to the second storage element and the fourth transistor to the fourth source line, wherein the first and second bit lines are different.

2. The memory device of claim 1, wherein the first voltage is greater than the second voltage.

3. The memory device of claim 1, further comprising a second write port, wherein the first memory cell further comprises a fifth transistor having a fifth gate coupled to a fifth word line of the plurality of word lines and a fifth source coupled to a fifth source line of the plurality of source lines; and wherein a write by the second write port to the first memory cell comprises activating the fifth transistor with a third voltage provided over the fifth word line to the fifth gate while the first and second transistors are inactive and while a current is supplied to the first bit line then to the first storage element and the fifth transistor to the fifth source line.

4. The memory device of claim 1, further comprising a second read port, wherein the second memory cell further comprises a fifth transistor having a fifth gate coupled to a fifth word line of the plurality of word lines and a fifth source coupled to a fifth source line of the plurality of source lines; and wherein a read by the second read port of the second memory cell comprises activating the fifth transistor with a third voltage provided over the fifth word line to the fifth gate while the third and fourth transistors are inactive and while a current is supplied to the second bit line then to the second storage element and the fifth transistor to the fifth source line.

5. The memory device of claim 1, wherein the write is followed by a verify of the first memory cell.

6. A memory device, comprising:
a write port and a read port; and
an array of memory cells coupled to the write port and to the read port, wherein each memory cell of the array is coupled to a respective bit line and comprises a respective storage element, respective write circuitry, and respective read circuitry;

wherein, for each said memory cell, the write circuitry comprises a first transistor having a first gate coupled to receive a first voltage from a first word line and also having a first source coupled to a first source line, and the read circuitry comprises a second transistor having a second gate coupled to receive a second voltage from a second word line and also having a second source coupled to a second source line, wherein the first transistor is active during a first write to the storage element but is inactive during a first read of the storage element, and wherein the second transistor is active during the first read but is inactive during the first write, wherein for the first write a current is supplied from the write port to the respective bit line to the storage element and to the first transistor to the first source line, and wherein for the first read a current is supplied from the read port to the respective bit line to the storage element and to the second transistor to the second source line.

7. The memory device of claim 6, wherein the array of memory cells comprises:
a first memory cell coupled to a first bit line; and
a second memory cell coupled to a second bit line different from the first bit line, wherein a write to the first memory cell and a read of the second memory cell are both executed during overlapping time periods.

8. The memory device of claim 7, wherein the write is followed by a verify of the first memory cell.

9. The memory device of claim 6, wherein the first voltage is greater than the second voltage.

10. The memory device of claim 6, further comprising a second write port, wherein the respective write circuitry of said each memory cell further comprises a third transistor having a third gate coupled to receive a third voltage from a third word line and also having a third source coupled to a third source line, wherein the third transistor is active during a second write but is inactive during the first write and during the first read, and wherein the first and second transistors are inactive during the second write, and wherein for the second write a current is supplied from the second write port to the respective bit line to the storage element and to the third transistor to the third source line.

11. The memory device of claim 6, further comprising a second read port, wherein the respective read circuitry of said each memory cell further comprises a third transistor having a third gate coupled to receive a third voltage from a third word line and also having a third source coupled to a third source line, wherein the third transistor is active during a second read but is inactive during the first write and during the first read, and wherein the first and second transistors are inactive during the second read, and wherein for the second read a current is supplied from the second read port to the respective bit line to the storage element and to the third transistor to the third source line.

12. The device of claim 6, wherein the storage element comprises a magnetoresistive random access memory (MRAM) cell comprising a magnetic tunnel junction (MTJ) that stores a binary bit value.

13. In a memory device comprising a write port, a read port, and memory cells, a method comprising:
performing a write, by the write port, to a first memory cell of the memory cells in a column parallel to a first bit line; and
performing a read, by the read port, of a second memory cell of the memory cells in a column parallel to a second bit line, when the second bit line is different from the first bit line;
wherein the first memory cell comprises a first transistor having a first gate coupled to a first word line and a first source coupled to a first source line, a second transistor having a second gate coupled to a second word line and a second source coupled to a second source line, and a first storage element for storing a first binary bit value, and wherein the second memory cell comprises a third transistor having a third gate coupled to a third word line and a third source coupled to a third source line, a fourth transistor having a fourth gate coupled to a fourth word line and a fourth source coupled to a fourth source line, and a second storage element for storing a second binary bit value;
wherein the method further comprises:
for the write to the first memory cell, activating the first transistor with a first voltage provided over the first word line to the first gate while the second transistor is inactive and while supplying a current to the first bit line then to the first storage element and the first transistor to the first source line; and
for the read of the second memory cell, activating the fourth transistor with a second voltage provided over the fourth word line to the fourth gate while the third transistor is inactive and while supplying a current to the second bit line then to the second storage element and the fourth transistor to the fourth source line.

14. The method of claim 13, further comprising performing a verify of the first memory cell after the write to the first memory cell.

15. The method of claim 13, wherein the memory device further comprises a second write port, wherein the first memory cell further comprises a fifth transistor having a fifth gate coupled to a fifth word line and a fifth source coupled to a fifth source line, the method further comprising, for a write by the second write port to the first memory cell, activating the fifth transistor with a third voltage provided over the fifth word line to the fifth gate while the first and second transistors are inactive and while supplying a current to the first bit line then to the first storage element and the fifth transistor to the fifth source line.

16. The method of claim 13, wherein the memory device further comprises a second read port, wherein the second memory cell further comprises a fifth transistor having a fifth gate coupled to a fifth word line and a fifth source coupled to a fifth source line, the method further comprising, for a read, by the second read port, of the second memory cell, activating the fifth transistor with a third voltage provided over the fifth word line to the fifth gate while the third and fourth transistors are inactive and while supplying a current to the second bit line then to the second storage element and the fifth transistor to the fifth source line.

17. The method of claim 13, wherein each memory cell of the memory cells comprises a respective magnetoresistive random access memory (MRAM) cell comprising a magnetic tunnel junction (MTJ) that stores a respective binary bit value.

* * * * *